(12) United States Patent
Yasumura et al.

(10) Patent No.: US 6,582,223 B2
(45) Date of Patent: Jun. 24, 2003

(54) PICKUP APPARATUS FOR SEMICONDUCTOR CHIPS

(75) Inventors: Hiroshi Yasumura, Nara (JP); Tadayuki Into, Tenri (JP); Noriki Iwasaki, Nara (JP); Yasuhiro Goto, Okayama (JP); Tatsuyuki Ishioka, Fukuyama (JP)

(73) Assignees: Sharp Kabushiki Kaisha, Osaka (JP); Sharp Takaya Electronic Industry Co., Ltd., Okayama (JP)

( * ) Notice: Subject to any disclaimer, the term of this patent is extended or adjusted under 35 U.S.C. 154(b) by 0 days.

(21) Appl. No.: 09/990,257

(22) Filed: Nov. 23, 2001

(65) Prior Publication Data

US 2002/0067982 A1 Jun. 6, 2002

(30) Foreign Application Priority Data

Nov. 24, 2000 (JP) ........................................ 2000-358571

(51) Int. Cl.⁷ ................................................. F27D 5/00
(52) U.S. Cl. ........................ 432/258; 438/459; 438/460
(58) Field of Search ................................ 432/251, 258, 432/261; 118/56; 414/936, 540, 941; 427/154, 155, 156; 438/459, 460, 759, 906

(56) References Cited

U.S. PATENT DOCUMENTS 6,297,075 B1 * 10/2001 Odajima et al. ............ 438/460
6,337,258 B1 *  1/2002 Nakayoshi et al. ......... 438/464
6,429,506 B1 *  8/2002 Fujii et al. .................. 257/620

FOREIGN PATENT DOCUMENTS

JP        2000-195877        7/2000

* cited by examiner

Primary Examiner—Gregory Wilson
(74) Attorney, Agent, or Firm—Birch, Stewart, Kolasch & Birch, LLP

(57) ABSTRACT

A semiconductor chip pickup apparatus of the present invention includes an aspiration section and an aspiration unit connected to the aspiration section, in which the aspiration unit includes a stage for mounting the semiconductor chip thereon and an adhesive sheet is attached to the semiconductor chip between the stage and the semiconductor chip, the stage includes undulations in at least a part of an area in which the semiconductor chip is mounted, and by operating the aspiration section, a suction force is applied to at least a part of an area in which the undulations are formed.

5 Claims, 6 Drawing Sheets

FIG.2(a-1)
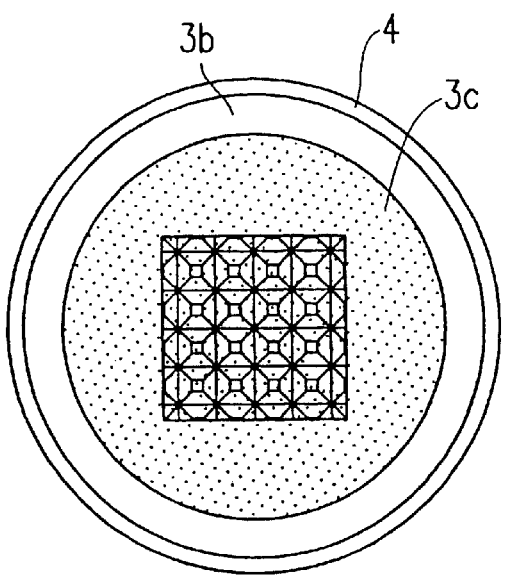
FIG.2(b-1)
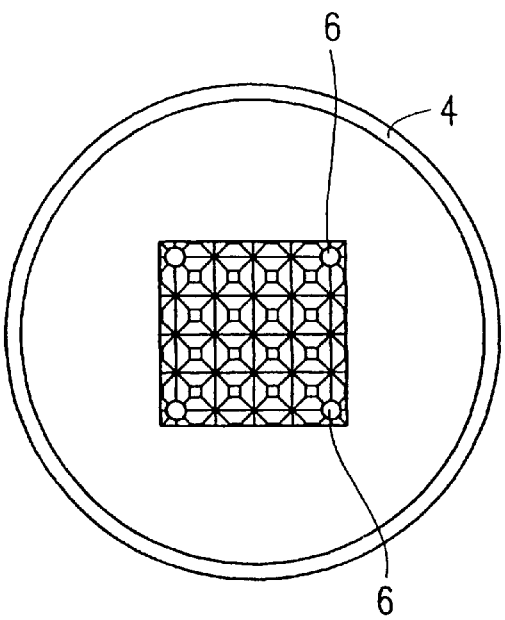
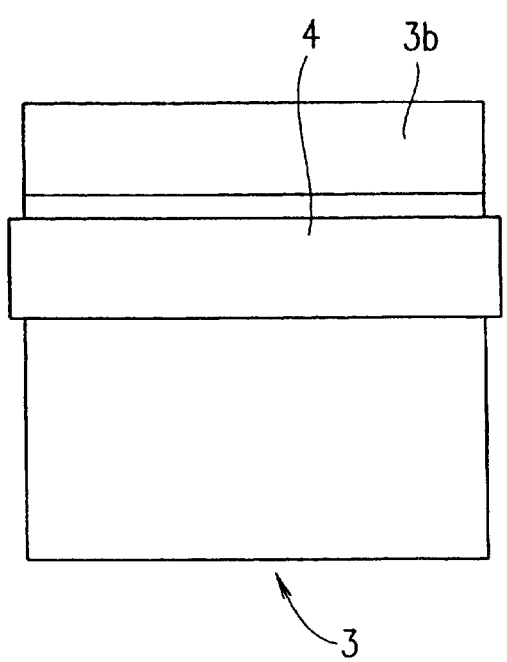
FIG.2(a-2)
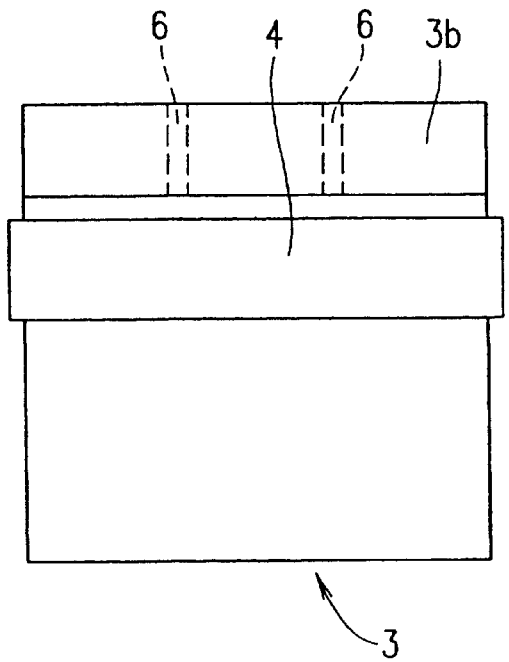
FIG.2(b-2)

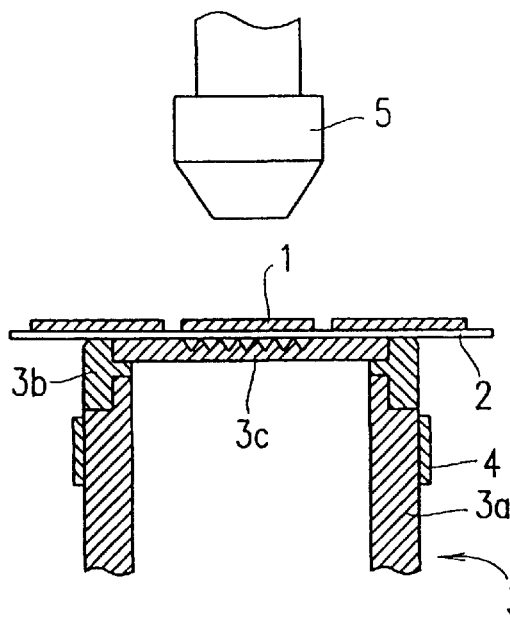
FIG.3(a)
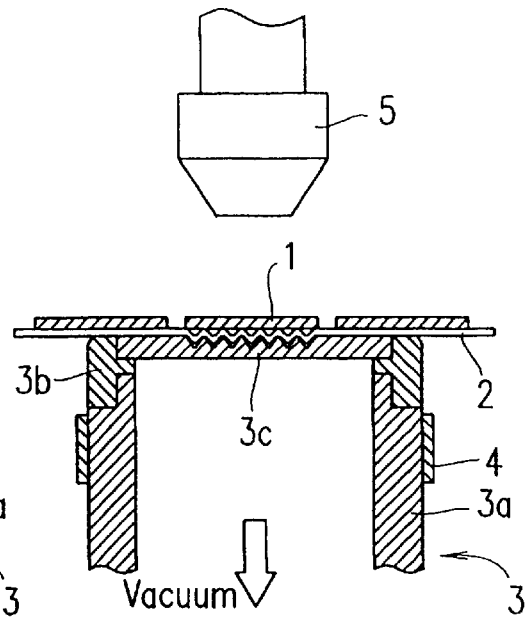
FIG.3(b)
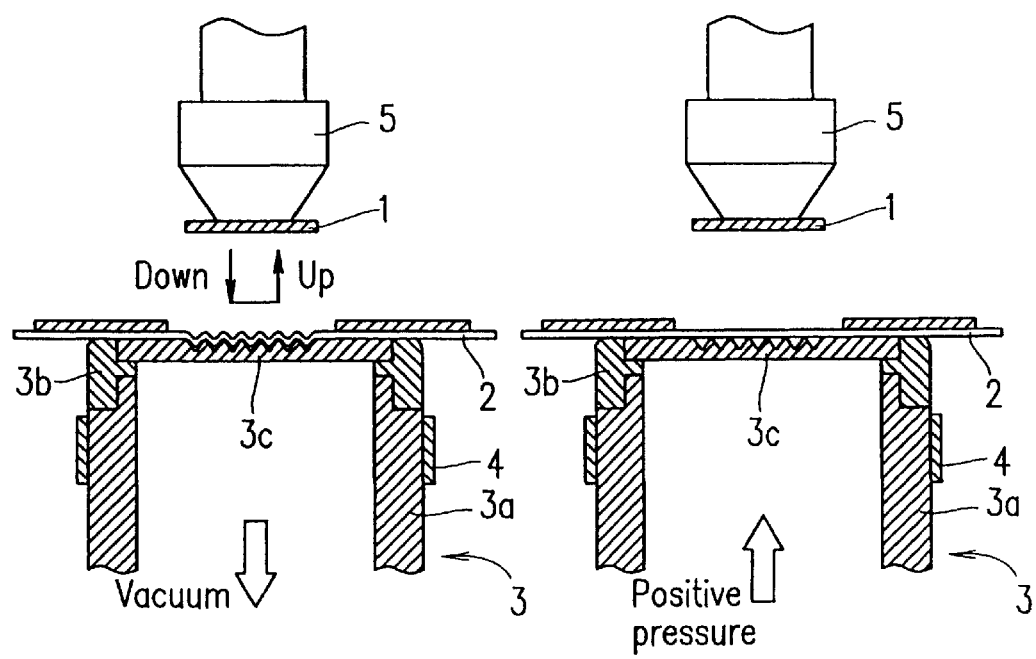
FIG.3(c)
FIG.3(d)

PICKUP APPARATUS FOR SEMICONDUCTOR CHIPS

This nonprovisional application claims priority under 35 U.S.C. §119(a) on Patent Application No. 2000-358571 filed in Japan on Nov. 24, 2000, which is herein incorporated by reference.

BACKGROUND OF THE INVENTION

1. Field of the Invention

The present invention relates to a pickup apparatus for separating semiconductor chips from an adhesive sheet.

2. Description of the Related Art

A production process of a semiconductor device is divided into first and second steps. In the first step, circuit components are formed on a semiconductor wafer. In the second step, the semiconductor wafer including the circuit components is diced into separate semiconductor chips, and the diced semiconductor chips are sealed in respective semiconductor packages.

In the second step, in order to convey the semiconductor chips obtained by dicing the semiconductor wafer to a packaging apparatus, a pickup apparatus picks up the semiconductor chips from an adhesive sheet used for fixing the semiconductor chips. Examples of conventional pickup apparatuses are as follows.

CONVENTIONAL EXAMPLE 1

FIG. 4 illustrates one of the conventional pickup apparatuses. This pickup apparatus includes a pushup unit 8 provided with pushup pins 7, and an aspiration mechanism, i.e., a vacuum mechanism (not shown). Firstly, the pickup apparatus brings a back face of an adhesive sheet 2 into contact with the pushup unit 8 and causes the adhesive sheet 2 to be held on the pushup unit 8 using the aspiration mechanism. Next, the pushup pins 7 housed in the pushup unit 8 are raised so as to push up a back face of a semiconductor chip 1, whereby the semiconductor chip 1 is separated from the adhesive sheet 2. Finally, the semiconductor chip 1 is picked up using a collet 6.

CONVENTIONAL EXAMPLE 2

Japanese Laid-Open Publication No. 2000-195877 discloses a pickup apparatus illustrated in FIGS. 5(a), (b), and (c). As illustrated in FIG. 5(a), this conventional pickup apparatus includes: a sheet holding mechanism (not shown) for holding a dicing sheet 13 (corresponding to the adhesive sheet 2 illustrated in FIG. 4) to which a semiconductor chip 11 is attached when the dicing sheet 13 is in a stretched state; a holding stage 12 in which grooves 12a connected to a plurality of aspiration paths (through holes) 12b (in FIGS. 5(a), (b) and (c), a distance between rightmost and leftmost paths corresponds to a length of the semiconductor chip 11); and an aspiration mechanism, i.e., a vacuum mechanism (not shown) for vacuum-holding the dicing sheet 13 to the holding stage 12 when separating the semiconductor chip 11 from the dicing sheet 13. In order to pick up the semiconductor chip 11 attached to the dicing sheet 13 using this conventional pickup apparatus, at first, the aspiration mechanism is operated so as to vacuum-hold the dicing sheet 13 to the holding stage 12 along the grooves 12a, so that as illustrated in FIG. 5(b), gaps are made between the semiconductor chip 11 and the dicing sheet 13, and the semiconductor chip 11 is caused to be easily separated from the dicing sheet 13. Thereafter, the semiconductor chip 11 is picked up using a collet 14 as illustrated in FIG. 5(c).

In this conventional pickup apparatus, the grooves 12a of the holding stage 12 are in the form of either concentric circles (FIG. 6 (a)), parallel lines (FIG. 6 (b)) a grille (FIG. 6 (c)) etc. The form of the grooves 12a can be suitably selected from these forms according to an external form of the semiconductor chip 11 so as to cause the semiconductor chip 11 to be easily peeled off the dicing sheet 13. In this conventional technique, since the holding stage 12 is replaced with another holding stage 12 of a suitable size according to a type of a semiconductor chip, e.g., a difference in size between different types of semiconductor chips, the grooves 12a are provided in the holding stage 12 across almost an entire surface thereof. The structures of Conventional Examples 1 and 2 have the following problems.

In the structure of Conventional Example 1 (FIG. 4), the pushup pins 7 which are sufficiently sharp so as to pierce the adhesive sheet 2 are required, and since such sharp pushup pins 7 push up the semiconductor chip 1, the back face of the semiconductor chip 1 is likely to be damaged. In particular, by supporting the semiconductor chip 1 on a few points, such as the pushup pins 7, stress is concentrated on those specific portions of the semiconductor chip 1, so that the semiconductor chip 1 may be damaged. In the case where the semiconductor chip 1 is thin, the semiconductor chip 1 can be cracked by the pushup action of the pushup pins 7.

In the structure of Conventional Example 2 (FIGS. 5(a)–(c) and 6(a)–(c)), a size of the holding stage 12 is optimized according to a size of the semiconductor chip 11 to be picked up. However, in the case where undulating grooves 12a are provided in the holding stage 12 across almost the entire surface thereof, other semiconductor chips adjacent the semiconductor chip 11 partially overlap with the holding stage 12 in areas 20 indicated by oblique lines in FIG. 7, so that not only is the semiconductor chip 11 separated from the dicing sheet 13, but also the other semiconductor chips adjacent the semiconductor chip 11 may be caused to be partially separated from the dicing sheet 13, where these other semiconductor chips should be fixed firmly to the dicing sheet 13 until they are meant to be picked up. Accordingly, it is possible for the other semiconductor chips adjacent the semiconductor chip 11 to be completely separated from the adhesive sheet 13 and scattered about when a semiconductor wafer including the semiconductor chips is moved. Since a size of an aspiration unit including the holding stage 12 cannot be small under restrictions of the pickup apparatus, in particular, when the size of the semiconductor chips is small, the other semiconductor chips adjacent the semiconductor chip 11 may be scattered about. This particularly causes a problem when the pickup apparatus is operated by automation.

SUMMARY OF THE INVENTION

According to one aspect of the present invention, there is provided a semiconductor chip pickup apparatus including an aspiration section and an aspiration unit connected to the aspiration section, in which the aspiration unit includes a stage for mounting the semiconductor chip thereon and an adhesive sheet is attached to the semiconductor chip between the stage and the semiconductor chip, the stage includes undulations in at least a part of an area in which the semiconductor chip is mounted, and by operating the aspiration section, a suction force is applied to at least a part of an area in which the undulations are formed.

According to one embodiment of the invention, the stage may be replaceable according to a type of the semiconductor chip.

According to another embodiment of the invention, at least a part of the stage including at least a part of the undulations may be formed of a porous material.

According to still another embodiment of the invention, at least one through hole may be formed in the area in which the undulations are formed.

According to still another embodiment of the invention, the pickup apparatus may further include a heating section for heating the undulations provided in the stage.

Hereinafter, functions of the semiconductor chip pickup apparatus of the present invention are described.

The semiconductor chip pickup apparatus of the present invention includes the aspiration section and the aspiration unit connected to the aspiration section. In a structure of the semiconductor chip pickup apparatus, by operating the aspiration section, a suction force is applied to at least a part of the undulations which are at least a part of an area formed in a stage of the aspiration unit in which a semiconductor chip is mounted. The aspiration section is operated so as to aspirate an adhesive sheet attached to the semiconductor chip and hold the adhesive sheet on the stage along the undulations to which a suction force is applied, and thus the adhesive sheet is partially separated from the semiconductor chip. This lowers adhesion between the semiconductor chip and the adhesive sheet, and thus the pickup of the semiconductor chip can be facilitated. Since it is not required to use conventional pushup pins, the semiconductor chip cannot be damaged by pushup pins and can be picked up in a stable condition. Moreover, since the undulations provided in the stage are formed in at least a part of the area in which the semiconductor chip is mounted, only a semiconductor chip to be picked up can be separated from the adhesion sheet and other semiconductor chips adjacent the semiconductor chip to be picked up can not be scattered about due to partial or full separation from the adhesive sheet. Even a small-sized semiconductor chip can be picked up in a stable condition from the adhesive sheet, and thus the present invention is suitable for use in an automated semiconductor chip producing apparatus or process.

Moreover, in the semiconductor chip pickup apparatus of the present invention, the stage provided to the aspiration unit is replaceable according to a type (size) of the semiconductor chip. Thus, the aspiration unit itself is not required to be adapted for a size of the semiconductor chip, such that it is preferable to use the aspiration unit which is slightly larger than the semiconductor chip. With this structure, areas in the stage in which the undulations are not formed effectively serve to fix the other semiconductor chips adjacent the semiconductor chip to be picked up. Moreover, even when the semiconductor chip pickup apparatus of the present invention is used for different types of semiconductor chips, only the stage is required to be replaced with another stage according to the sizes of the semiconductor chips, thereby eliminating complicated adjustments, which are required for replacing pushup pins, for example.

Moreover, in the semiconductor chip pickup apparatus of the present invention, at least a part of the stage including at least a part of the undulations is formed of a porous material, and thus the adhesive sheet attached to the semiconductor chip can be effectively aspirated.

Alternatively, in the semiconductor chip pickup apparatus of the present invention, at least one through hole is formed in the area in which the undulations are formed, and thus the adhesive sheet attached to the semiconductor chip can be effectively aspirated.

Moreover, the semi conductor chip pickup apparatus of the present invention further includes a heating section for heating the undulations provided in the stage, and thus by heating the aspiration unit, such that heat from the aspiration unit lowers adhesion of the adhesive sheet to the semiconductor chip, separation of the semiconductor chip from the adhesive sheet can be facilitated. In particular, an aspiration cylinder which is a main part of the aspiration unit is a suitable member to be provided with the heating section.

Thus, the invention described herein makes possible the advantage of providing an apparatus for picking up semiconductor chips which is capable of picking up only a semiconductor chip to be picked up in a semiconductor chip pickup step by lowering adhesion of an adhesive sheet so as to separate the semiconductor chip to be picked up from the adhesive sheet without causing damage to the semiconductor chips even when they are thin.

This and other advantages of the present invention will become apparent to those skilled in the art upon reading and understanding the following detailed description with reference to the accompanying figures.

BRIEF DESCRIPTION OF THE DRAWINGS

FIG. 2 includes a top view (a-1) and a side view (a-2) of an aspiration unit illustrating a shape of a holding stage which includes an aspiration section formed of a porous material, and also includes a top view (b-1) and a side view (b-2) of an aspiration unit illustrating a holding stage in which vacuum holes are provided.

FIG. 3 includes schematic views (a), (b), (c), and (d) illustrating examples of a pickup operation of the semiconductor chip pickup apparatus according to an embodiment of the present invention.

DESCRIPTION OF THE PREFERRED EMBODIMENTS

Hereinafter, embodiments of the present invention will be described with reference to the attached drawings.

Figure 1:
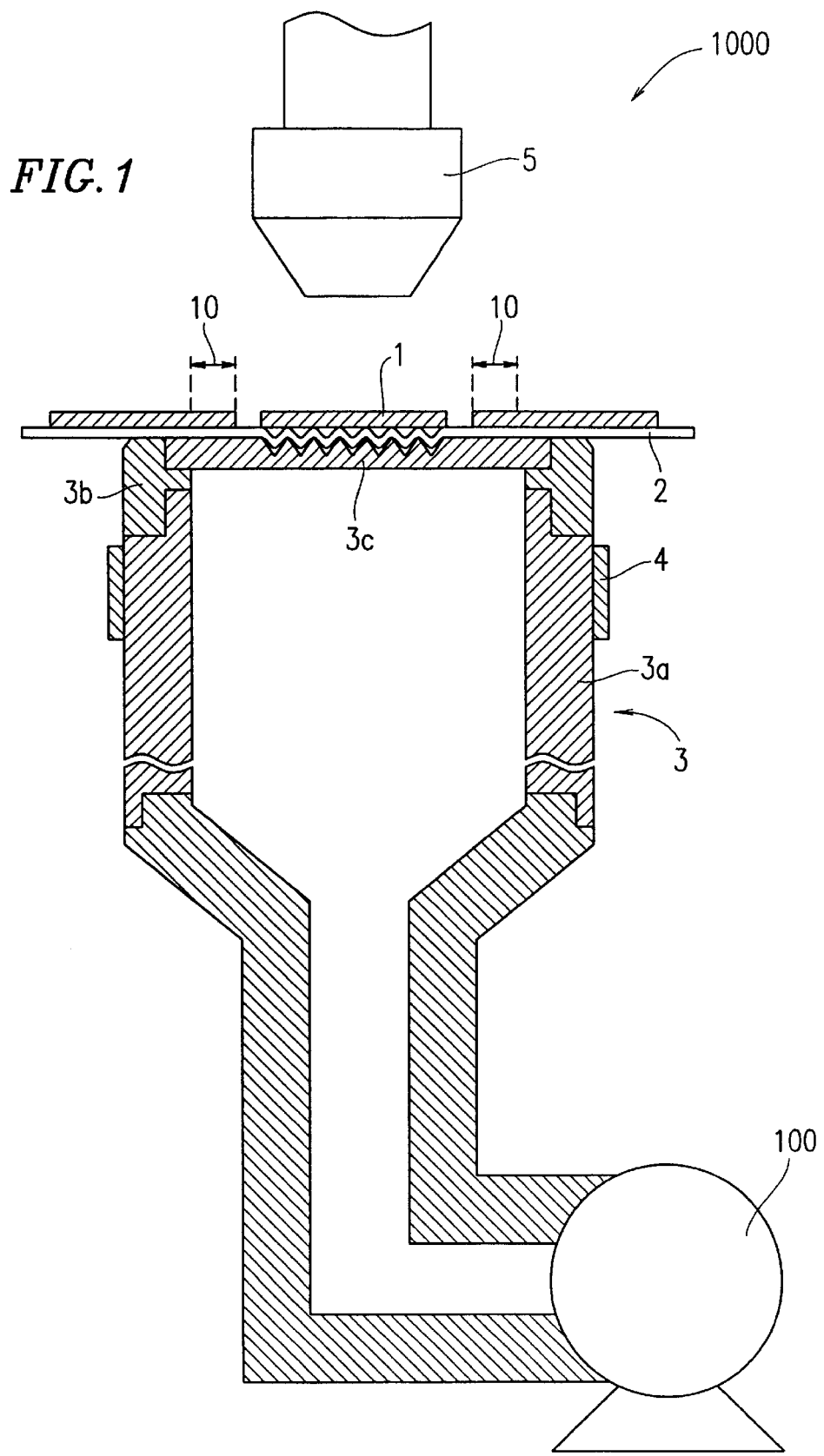
FIG. 1 is a cross-sectional view illustrating a schematic structure of a semiconductor chip pickup apparatus according to an embodiment of the present invention.
Figure 4:
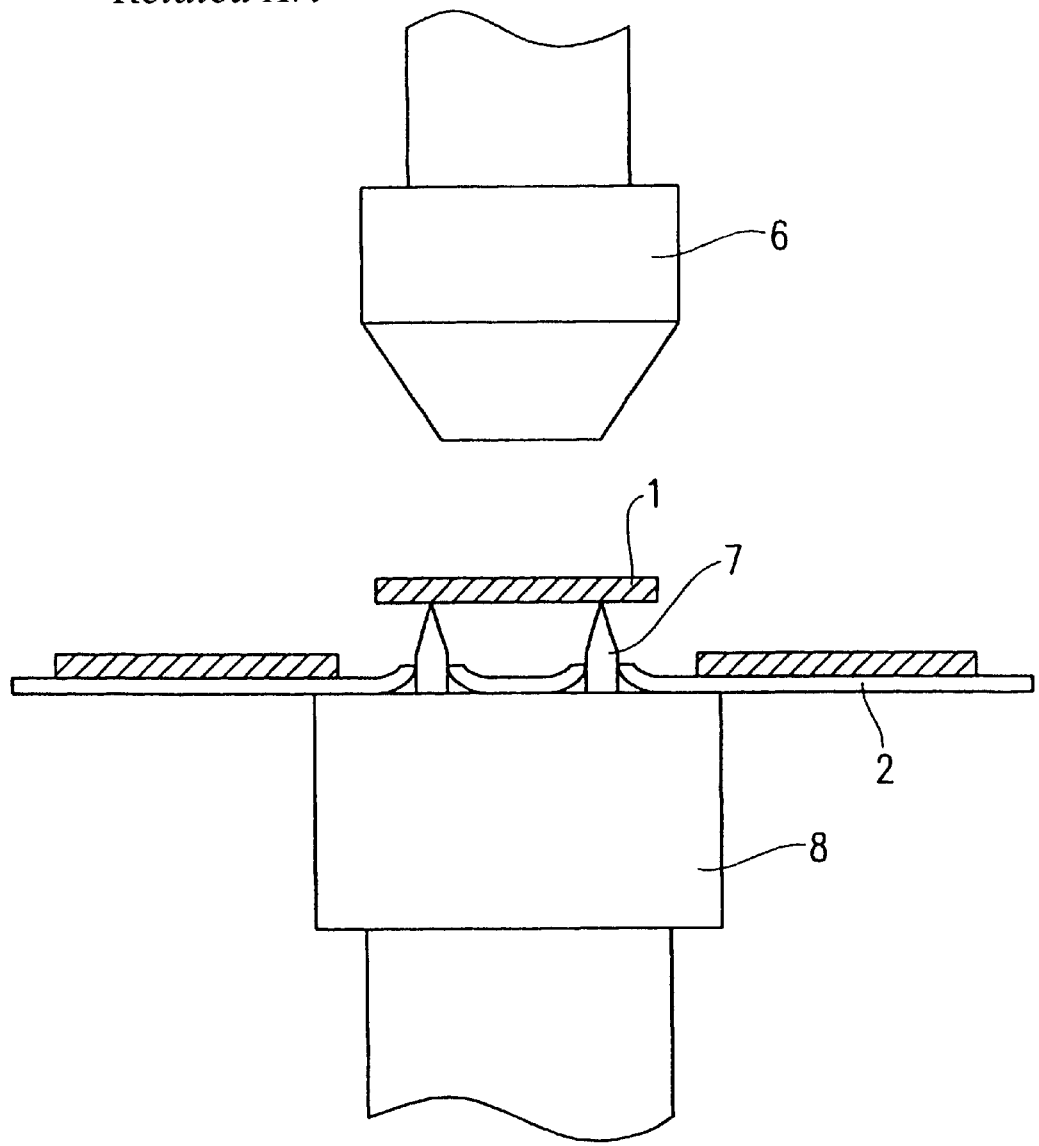
FIG. 4 is a cross-sectional view illustrating a schematic structure of a conventional semiconductor chip pickup apparatus.
Figure 5A:
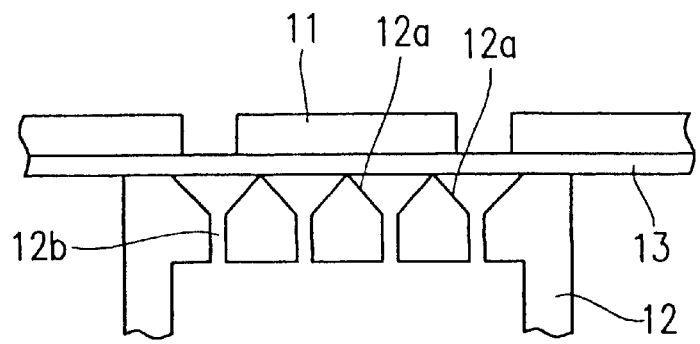
FIG. 5 includes cross-sectional views (a), (b) and (c) illustrating a schematic structure of another conventional semiconductor chip pickup apparatus.
Figure 5B:
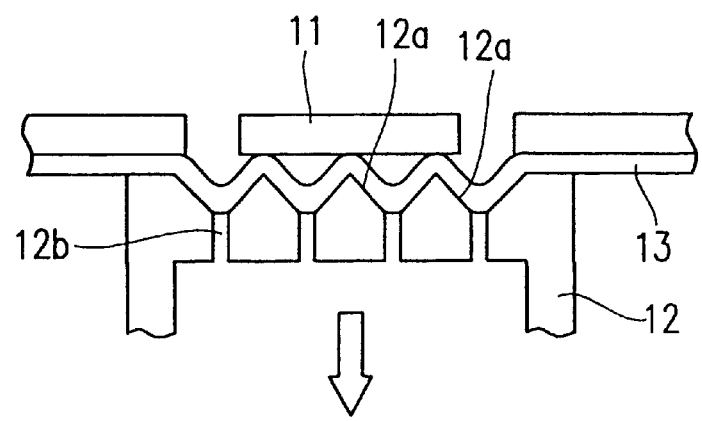
Figure 5C:
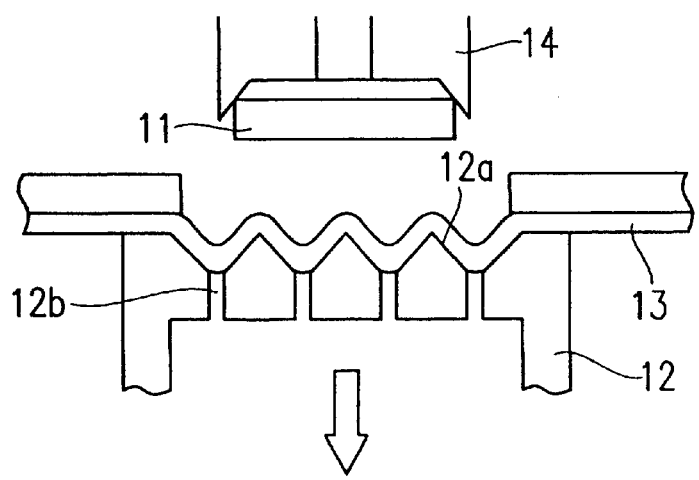
Figure 6A:
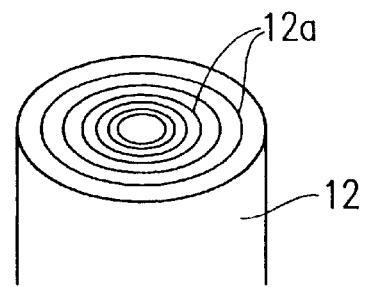
FIG. 6 includes perspective views (a), (b) and (c) illustrating the forms of aspiration grooves provided in a stage of the conventional semiconductor chip pickup apparatus of FIG. 5.
Figure 6B:
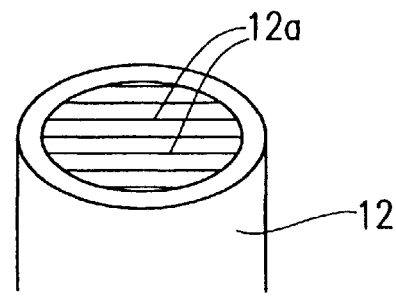
Figure 6C:
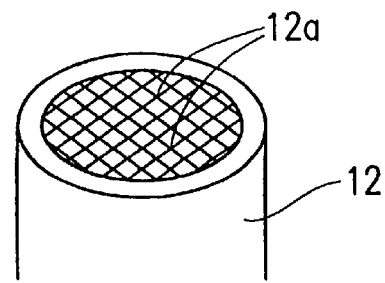
Figure 7:
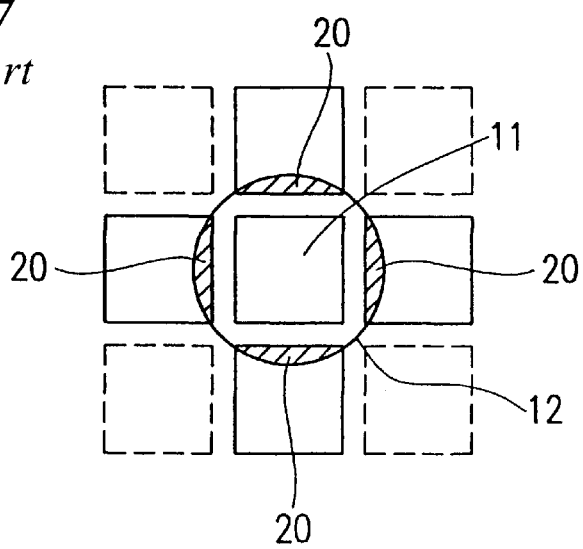
FIG. 7 is a top view used for explaining a problem caused in conventional semiconductor chip pickup apparatuses.

FIG. 1 is a cross-sectional view illustrating a structure of a semiconductor chip pickup apparatus 1000 according to an embodiment of the present invention. The semiconductor chip pickup apparatus 1000 can pick up a semiconductor chip 1 attached to a dicing (adhesive) sheet 2. The semiconductor chip pickup apparatus 1000 includes an aspiration section 100, i.e., a vacuum section, and an aspiration unit 3 connected to the aspiration section 100. In the embodiment illustrated in FIG. 1, the aspiration unit 3 includes a heater 4 for heating a stage 3*b* of the aspiration unit 3.

The aspiration unit 3 also includes an aspiration cylinder 3*a* and a holding section 3*c*. The stage 3*b* is fixed to the aspiration cylinder 3*a* by screws, etc and has the holding section 3c included therein. The stage 3b can be readily replaced with a suitable stage according to the sizes of different types of semiconductor chips to be picked up. The stage 3b includes undulations formed in an area in which the semiconductor chip 1 is mounted. By operating the aspiration section 100, a suction force is applied to the area in which the undulations are formed. With this structure, a contact area between the semiconductor chip 1 and the adhesive sheet 2 can be reduced by performing the aspiration, and thus the pickup of the semiconductor chip 1 can be facilitated.

FIG. 2 illustrates a top view (a-1) and a side view (a-2) of the aspiration unit 3.

In the aspiration unit 3 illustrated in the top view (a-1) and the side view (a-2) of FIG. 2, the holding section 3c included in the stage 3b is entirely formed of a porous material. In this embodiment, the undulations are formed only in a rectangular area equivalent in size to the semiconductor chip 1. The undulations are in the form of, for example, pyramids. However, the present invention is not limited to this, and the undulations can be in any form as long as the undulations can support the semiconductor chip 1 on points which are small in area and sufficiently large in number so as to support the semiconductor chip 1, and can also lower adhesion of the adhesion sheet 2 to which the semiconductor chip 1 to be picked up is attached. It is preferable that protruding portions of the undulations are blunt so as not to damage the semiconductor chip 1.

Instead of using a porous material, the aspiration may be performed using vacuum (through) holes 6 provided in the stage 3b as illustrated in a top view (b-1) and a side view (b-2) of the aspiration unit 3.

The aspiration cylinder 3a may include the heater 4. The heater 4 heats the stage 3b such that heat from the stage 3b warms the adhesive sheet 2. This lowers the adhesion of the adhesive sheet 2 to the semiconductor chip 1 due to the adhesive material of the adhesive sheet 2. Moreover, the adhesive sheet 2 becomes stretchable due to the heating, so that adherence (airtightness) of the adhesive sheet 2 to the recessed portions of the undulations provided in the stage 3b is improved. As a result, the semiconductor chip 1 can be easily separated from the adhesive sheet 2. It should be noted that the heater 4 may be provided to any member other than the aspiration cylinder 3a so long as the heater 4 effectively warms the adhesive sheet 2 so as to attain the same effect described above.

It is preferable that the adhesive sheet 2 is sufficiently extensible to facilitate separation of the semiconductor chip 1 and the adhesive sheet 2 and that the adhesion of the adhesive sheet 2 is lowered by ultraviolet irradiation, etc. For example, the adhesive sheet 2 preferably includes a polyolefin substrate and an acrylic adhesive so as to have the characteristics described above.

The collet 5 picks up the semiconductor chip 1 provided with the lowered adhesion to the adhesive sheet 2 from the stage 3b so as to convey the semiconductor chip 1 and set the semiconductor chip 1 for a subsequent step of the semiconductor device production process.

Next, description will be given with respect to a method for picking up the semiconductor chip 1 attached to the adhesive sheet 2 using the semiconductor chip pickup apparatus 1000 according to the present invention. FIG. 3 includes schematic views (a), (b), (c) and (d) illustrating functions of each part of the semiconductor chip pickup apparatus 1000 in order of operation when a designated semiconductor chip 1 is picked up.

Referring to the schematic view (a) of FIG. 3, the semiconductor chip 1 attached to the adhesive sheet 2 is located so as to properly overlap with the undulations in the stage 3b of the aspiration unit 3.

Referring to the schematic view (b) of FIG. 3, the adhesive sheet 2 is held on the stage 3b by performing the aspiration, so that the adhesive sheet 2 is deformed according to the undulations of the stage 3b. As a result, portions of the adhesive sheet 2 corresponding to the recessed portions of the undulations provided in the stage 3b are separated from the semiconductor chip 1. Thus, the semiconductor chip 1 is in contact with the adhesive sheet 2 only on the protruding portions of the undulations and as such the adhesion between the semiconductor chip 1 and the adhesion sheet 2 is lowered.

In this case, if the stage 3b is heated by the heater 4 provided to the aspiration cylinder 3a, the heat from the stage 3b causes the adhesive sheet 2 to be stretchable and the adhesion between the adhesive sheet 2 and the semiconductor chip 1 is lowered, thereby facilitating the pickup operation of the semiconductor chip 1.

Since the area in which the undulations of the stage 3b are formed is not larger than an area in which the semiconductor chip 1 is mounted (i.e., the undulations do not extend outside of the semiconductor chip 1), only the semiconductor chip 1 to be picked up is separated from the adhesive sheet 2 and the other semiconductor chips adjacent the semiconductor chip 1 are not separated from the adhesive sheet 2 during the picking up of the semiconductor chip 1.

In a structure of the semiconductor chip pickup apparatus 1000 according to this embodiment, the undulations are formed across the area in which the semiconductor chip 1 is mounted, and by operating the aspiration section 100, a suction force is applied to the entire area in which the undulations are formed. However, the semiconductor chip pickup apparatus 1000 is not required to have such a structure so long as the undulations are formed in at least a part of the area in which the semiconductor chip 1 is mounted, and by operating the aspiration section 100, a suction force is applied to at least a part of the area in which the undulations are formed. The reason for this is that so long as the semiconductor chip pickup apparatus 1000 has this basic structure, by performing the aspiration, the semiconductor chip 1 and the adhesive sheet 2 are partially separated from each other and the adhesion between them is lowered.

It is preferable that at least a part of the stage 3b including at least a part of the undulations is formed of a porous material.

Alternatively, it is preferable that at least one through hole is formed in the area in which the undulations are formed.

In the case where the stage 3b is formed of a porous material, the adhesive sheet 2 can be stably aspirated, and the semiconductor chip 1 and the adhesive sheet 2 can be reliably separated from each other in comparison to the case where vacuum holes 6 (the top view (b-1) of FIG. 2) are provided to perform the aspiration. In such a case, the use of aspiration enables stable fixation of the semiconductor chips to the adhesive sheet 2 in regions (denoted by reference numeral 10 in FIG. 1) including areas in the porous material where the undulations are not formed overlapping with the other semiconductor chips adjacent the semiconductor chip 1. Thus, in the semiconductor chip pickup step of the semiconductor chip 1 or subsequent steps, i.e., any movement of the semiconductor chip pickup apparatus 1000, the other semiconductor chips adjacent the semiconductor chip 1 are not scattered about.

Referring to the schematic view (c) of FIG. 3, the adhesion of the adhesive sheet 2 to the semiconductor chip 1 is lowered by performing aspiration and the collet 5 is moved up and down so as to pick up the semiconductor chip 1.

Referring to the schematic view (d) of FIG. 3, the aspiration is stopped so as to again provide the adhesive sheet 2 to be separated from the stage 3b. In this case, it is preferable to switch over a vacuum valve (not shown) to create positive pressure in the aspiration cylinder 3.

Thereafter, the steps described with reference to schematic views (a)–(d) of FIG. 3 are repeated to sequentially pick up and convey designated semiconductor chips to a subsequent step of the production process.

A semiconductor chip pickup apparatus of the present invention includes an aspiration section and an aspiration unit connected to the aspiration section. In a structure of the semiconductor chip pickup apparatus, by operating the aspiration section, a suction force is applied to at least a part of the undulations which are at least a part of an area formed in a stage of the aspiration unit in which a semiconductor chip is mounted. The aspiration section is operated so as to aspirate an adhesive sheet attached to the semiconductor chip and hold the adhesive sheet on the stage along the undulations to which a suction force is applied, and thus the adhesive sheet is partially separated from the semiconductor chip. This lowers adhesion between the semiconductor chip and the adhesive sheet, and thus the pickup of the semiconductor chip can be facilitated. Since it is not required to use conventional pushup pins, the semiconductor chip cannot be damaged by pushup pins and can be picked up in a stable condition. Moreover, since the undulations provided in the stage are formed in at least a part of the area in which the semiconductor chip is mounted, only a semiconductor chip to be picked up can be separated from the adhesion sheet and other semiconductor chips adjacent the semiconductor chip to be picked up can not be scattered about due to partial or full separation from the adhesive sheet. Even a small-sized semiconductor chip can be picked up in a stable condition from the adhesive sheet, and thus the present invention is suitable for use in an automated semiconductor chip producing apparatus or process.

Moreover, in the semiconductor chip pickup apparatus of the present invention, the stage provided to the aspiration unit is replaceable according to a type (size) of the semiconductor chip. Thus, the aspiration unit itself is not required to be adapted for a size of the semiconductor chip, such that it is preferable to use the aspiration unit which is slightly larger than the semiconductor chip. With this structure, areas in the stage in which the undulations are not formed effectively serve to fix the other semiconductor chips adjacent the semiconductor chip to be picked up. Moreover, even when the semiconductor chip pickup apparatus of the present invention is used for different types of semiconductor chips, only the stage is required to be replaced with another stage according to the sizes of the semiconductor chips, thereby eliminating complicated adjustments, which are required for replacing pushup pins, for example.

Moreover, in the semiconductor chip pickup apparatus of the present invention, at least a part of the stage including at least a part of the undulations is formed of a porous material, and thus the adhesive sheet attached to the semiconductor chip can be effectively aspirated.

Alternatively, in the semiconductor chip pickup apparatus of the present invention, at least one through hole is formed in the area in which the undulations are formed, and thus the adhesive sheet attached to the semiconductor chip can be effectively aspirated.

Moreover, the semiconductor chip pickup apparatus of the present invention further includes a heating section for heating the undulations provided in the stage, and thus by heating the aspiration unit, such that heat from the aspiration unit lowers adhesion of the adhesive sheet to the semiconductor chip, separation of the semiconductor chip from the adhesive sheet can be facilitated. In particular, an aspiration cylinder which is a main part of the aspiration unit is a suitable member to be provided with the heating section.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor chip pickup apparatus, comprising:
    an aspiration section;
    an aspiration unit connected to the aspiration section,
    wherein the aspiration unit includes a stage for mounting a semiconductor chip thereon and an adhesive sheet is attached to the semiconductor chip between the stage and the semiconductor chip and the stage includes undulations in only a part of an area in which the semiconductor chip is mounted; and
    a collet for picking up the semiconductor chip from the stage upon which the semiconductor chip is mounted,
    wherein while a suction force is applied to at least a part of an area in which the undulations are formed by operating the aspiration section, the collet picks up the semiconductor chip from the stage.

2. A pickup apparatus according to claim 1, wherein the stage is replaceable according to a type of the semiconductor chip.

3. A pickup apparatus according to claim 1, wherein at least a part of the stage including at least a part of the undulations is formed of a porous material.

4. A pickup apparatus according to claim 1, wherein at least one through hole is formed in the area in which the undulations are formed.

5. A pickup apparatus according to claim 1, further comprising a heating section for heating the undulations provided in the stage.

* * * * *